(12) United States Patent
Arknaes-Pedersen

(10) Patent No.: US 9,520,843 B2
(45) Date of Patent: Dec. 13, 2016

(54) POWER AMPLIFIERS COUPLED IN SERIES

(71) Applicant: The TC Group A/S, Risskov (DK)

(72) Inventor: Lars Arknaes-Pedersen, Viby J (DK)

(73) Assignee: MUSIC GROUP IP LTD, Tortola (VG)

( * ) Notice: Subject to any disclaimer, the term of this patent is extended or adjusted under 35 U.S.C. 154(b) by 50 days.

(21) Appl. No.: 14/589,128

(22) Filed: Jan. 5, 2015

(65) Prior Publication Data

US 2016/0197587 A1 Jul. 7, 2016

(51) Int. Cl.
| | |
|---|---|
| *H04R 27/00* | (2006.01) |
| *H03F 1/56* | (2006.01) |
| *H03F 1/02* | (2006.01) |
| *H03F 3/187* | (2006.01) |
| *H03F 3/217* | (2006.01) |
| *H03F 3/183* | (2006.01) |
| *H03F 3/21* | (2006.01) |
| *H04R 3/00* | (2006.01) |

(52) U.S. Cl.
CPC ............ *H03F 1/565* (2013.01); *H03F 1/0283* (2013.01); *H03F 3/183* (2013.01); *H03F 3/187* (2013.01); *H03F 3/211* (2013.01); *H03F 3/217* (2013.01); *H03F 3/2173* (2013.01); *H04R 27/00* (2013.01); *H03F 2200/03* (2013.01); *H03F 2200/189* (2013.01); *H03F 2200/321* (2013.01); *H03F 2200/351* (2013.01); *H03F 2203/21142* (2013.01)

(58) Field of Classification Search
CPC ........ H03F 1/565; H03F 1/0283; H03F 3/183; H03F 3/211; H03F 3/217; H03F 3/2173; H03F 2200/03; H03F 2200/189; H03F 2200/321; H03F 2200/351; H03F 2203/21142; H04R 27/00
USPC ....... 381/82, 120; 330/207 A, 251, 127, 297
See application file for complete search history.

(56) References Cited

U.S. PATENT DOCUMENTS

| | | | | |
|---|---|---|---|---|
| 6,671,329 | B1 * | 12/2003 | Lenz | ................. G01R 33/3852 330/10 |
| 2002/0097090 | A1 | 7/2002 | Smedegaard-Pedersen | |
| 2008/0309406 | A1 * | 12/2008 | Jonkman | ................... H03F 1/26 330/251 |
| 2011/0128075 | A1 | 6/2011 | Maier | |

FOREIGN PATENT DOCUMENTS

WO 2014113027 A1 7/2014

* cited by examiner

*Primary Examiner* — Vivian Chin
*Assistant Examiner* — Ammar Hamid
(74) *Attorney, Agent, or Firm* — Cantor Colburn LLP

(57) ABSTRACT

A power amplifier system is disclosed, the power amplifier system comprising two power supplies, four amplifier half-bridges arranged as two amplifier full bridges, and an audio processor for establishing control signals for the amplifier full-bridges, where the audio processor and one of the power supplies share a common ground potential, whereas the other power supply has a floating ground; wherein both the amplifier with common ground and the amplifier with floating ground have an amplifier interconnection output and an amplifier output, and wherein the amplifier interconnection outputs are connected, and a load is connected to the amplifier outputs. Further are disclosed amplification methods and PA systems correspondingly.

32 Claims, 10 Drawing Sheets

POWER AMPLIFIERS COUPLED IN SERIES

BACKGROUND

Figure 1:
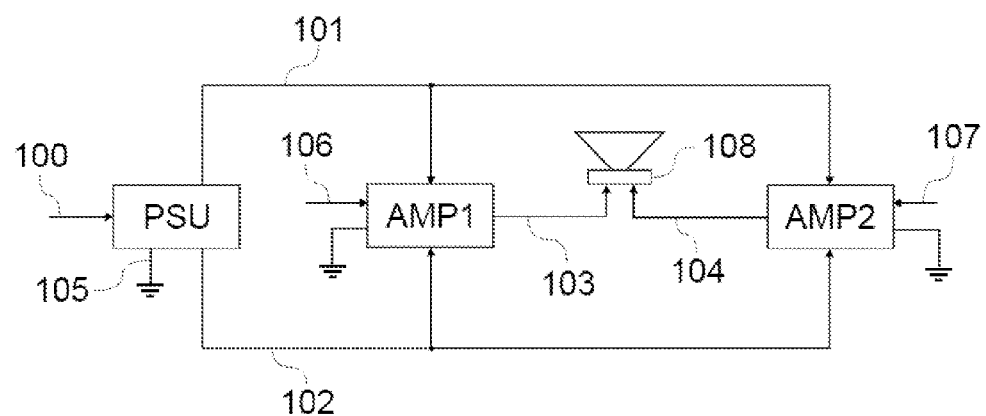

The present invention relates to high voltage audio amplifiers.

High voltage audio amplifiers are often used in fixed audio installations having large distances from the audio power amplifier to the loudspeaker. Such installations are often characterized by having several loudspeakers connected to the same amplifier output channel. To keep the loudspeaker transmission line power loss to reasonable low level, the voltage of the amplifier output is kept at a high level resulting in a low current and thus a low power loss in the long transmission line, since power equals the current squared multiplied with the transmission line resistance. To match the low impedance (4-8 Ohm) dynamic loudspeaker typically used in these installations, each single loudspeaker is equipped with a transformer that transforms the signal to a suitable low voltage level. Exactly the same principle is used when transporting energy from electrical power plants to the consumer 115/230 VAC power outlet. In this case the energy is transported hundreds of km through relatively thin high-voltage power lines passing through local transformer stations, where the voltage is transformed to the typical 115/230 VAC consumer levels.

The audio installation systems described above are often named Constant Voltage Amplifiers, high-voltage audio distribution systems or 70 V/100 V Amplifiers, and to reach the high output voltage requirement different techniques are used today. A very common approach is to use a traditional audio amplifier with limited voltage capabilities and equip that with a rather large audio transformer to convert the raw amplifier output to a higher voltage level. This has of course a price, size and weight penalty compared to a pure solid state solution. It should be mentioned that this transformer has to pass the full amount of power to several loudspeakers and the power capability of this output transformer should in principle equal the sum of the power capabilities of the transformers found in the loudspeaker chain connected. Typically, transformers have limited low frequency response, since the transformer easily runs into core saturation due to a high transformer current at low audio frequency.

Another technique to establish a high voltage amplifier output is to design a solid state amplifier that can produce the high voltage directly. With the rise of Class-D audio amplifier technologies, this technique is seen more and more. However, the voltage requirements to such designs are still quite tough with presently available power transistors. Aiming for 70 Vrms output capability, this requires transistors rated to higher than 100V for a full-bridge design and higher than 200V for a single-ended design. At these voltage levels, a discrete design is required since no monolithic power device exists that can sustain this voltage potential.

A few other techniques to overcome the issues with limited transistor voltage capabilities are known from prior art.

US Patent Application Publication No. 2008/0309406 A1 (Jonkman) describes a full-bridge design in which one of the two amplifier outputs is connected to ground. This requires that the amplifier bridge is powered by a floating power supply since both switching node outputs have to be able to take the position of both full positive rail and full negative rail, so if the amplifier bridge should operate as intended (seen from the load perspective), the supply voltage cannot relate to ground in this design. In the patent application it is mentioned that two such amplifiers can be bridged requiring two isolated power supplies.

U.S. Pat. No. 6,671,329 (Lenz) describes a high voltage gradient amplifier design for a magnetic resonance tomography apparatus. This design consists of a series connection of several PWM amplifiers each having individual floating power supplies.

Both of the designs mentioned above require an isolated power supply per full bridge along with electrically isolated control and feedbacks signal to and from each full bridge. Besides the mentioned control and feedback signals, several other signals often also need to be transmitted out from or into the isolated circuit, thus quickly requiring a very high number of isolated signal transfers. Such further signals that are often desired may include "status", "warning" and "error" data between controller and power supplies, and between controller and amplifiers.

SUMMARY

The inventor has identified the above-mentioned problems and challenges related to high voltage audio amplifiers and made the below-described invention. Objects comprise to provide a high voltage audio amplifier using low cost and low voltage amplifier building blocks and/or to provide a high voltage audio amplifier using standard off-the-shelf monolithic power devices and/or other improvements or alternatives to the prior art.

In an aspect the present invention relates to a power amplifier system comprising an audio processor comprising an audio input and a control output; a first amplifier full bridge connected to a first power supply; and a second amplifier full bridge connected to a second power supply; wherein an amplifier interconnection output of said first amplifier is connected to an amplifier interconnection output of said second amplifier; wherein said first amplifier and said second amplifier each comprises an amplifier output for a load to be connected in between; wherein said first power supply and said audio processor has a common ground potential and said first amplifier is connected to said control output; wherein said second power supply is floating with respect to said common ground potential and said second amplifier is connected to said control output through an isolation barrier.

The disclosed power amplifier system may enable establishing a high voltage audio amplifier using low cost and low voltage amplifier building blocks. Compared to traditional single ended and bridge-tied-load amplifier systems designed for high output voltage operation, which require discrete power transistors that can handle the high voltage levels, the amplifier design of an aspect of this invention can be built from standard off-the-shelf monolithic power devices. Such devices typically contain all required protection schemes like over-current protection, short circuit protection, over-temperature protection, under-voltage protection and over-voltage protection. Beside the benefit of low price and high number of functions built into the device, these devices are also advantageous in applications that has to pass a safety approval phase, like the North American certification CSA mark, since the complexity and required number of short-circuits in the safety test procedure is reduced, compared to a design using discrete power devices. This makes the test procedure much simpler to carry out and to pass.

Compared to prior art which describes techniques of bridging and/or series-coupling of bridge-tied-load amplifier systems, the disclosed power amplifier system reduces the requirement of electrical isolation between the amplifier control mechanism and the amplifier itself and may also offers a reduced number of isolated power supply required. With the disclosed power amplifier system it requires less circuitry to transmit control signals to the amplifiers than known from prior art, as one of the two amplifiers shares the common ground potential with the audio processor. Hence, the requirements for isolation barriers for e.g. "status", "warning" or "error" data signals are decreased. This may for example relate to "powerdown" or "tristate", etc., signals from controller to amplifier, "thermal warning" or "fault", etc., from amplifier to controller, "turn on", "turn off", "standby", "power save", etc., from controller to power supply, and "overcurrent", "overtemperature", "overvoltage", "undervoltage", "voltagesense", "temperaturesense", "currentsense", etc., from power supply to controller. With the present invention, blocks sharing the common ground may communicate without the need for isolation barriers, and even status about the blocks, e.g. one power supply and one amplifier, that has a non-common ground potential, may be facilitated by the common ground blocks as they are preferably identically implemented and several of the properties and states may therefore be assumed identical from the isolated blocks.

In a preferred embodiment of the invention, the amplifier system consist of two identical full bridge amplifiers, where one of these amplifiers shares ground potential with the rest of the system and the other is electrically isolated and floating from the rest of the system. Audio and control signals from the amplifier control mechanism are passed to and from the amplifier that shares common ground with the rest of the system, but also to the amplifier that are electrically isolated from the system ground. In the latter case, the signals pass through an isolation barrier based on optically, capacitive, inductive, magnetically or radio frequency transfer techniques or any other suitable technology that solves this task. Assuming near-identical differential audio signals at the two amplifier output terminals, establishing a serial link, where opposite phase terminals from the two amplifiers are connected, will result in twice the voltage across the remaining two amplifier terminals.

In an advantageous embodiment said first amplifier full bridge and said second amplifier full bridge are integrated on a single-chip device comprising at least four amplifier half-bridges, or on two chips mounted on a common printed circuit board PCB where each chip comprises at least two half-bridges.

In a preferred embodiment of the invention, the full bridge amplifiers consist of single-chip components similar to PWM input, PWM output devices like STA516B and TAS5162.

In a preferred embodiment of the invention, the full bridge amplifiers consist of single-chip components similar to analog input, PWM output devices like TDA7498MV and TDA8920.

In a preferred embodiment of the invention, the full bridge amplifiers consist of single-chip components similar to class AB devices like TDA2030 and LM3886.

In an advantageous embodiment said first power supply and said second power supply are arranged to supply no more than 80V DC, for example having a rating of 80V DC, 70V DC, 60V DC or 50V DC potential from rail-to-rail of each power supply. According to an aspect of the invention, a supply of 80V rail-to-rail will provide a maximum of 160V peak-to-peak as seen from the load, i.e. up to about 113 Vrms, and for example even a supply of only 60V rail-to-rail will provide a maximum of 120V peak-to-peak as seen from the load, i.e. up to about 85Vrms. Thereby common 70V or 100V high-voltage distribution systems may be implemented according to an embodiment of the present invention without requiring e.g. transistors rated at 100V or more.

In an advantageous embodiment said first amplifier full bridge and said second amplifier full bridge together comprise four amplifier half-bridges, and wherein a rail-to-rail supply voltage to each amplifier half-bridge is no more than 80V, such as for example 80V, 70V, 60V or 50V.

The power amplifier system establishes a resultant high voltage output using low voltage building blocks. This is done by treating each amplifier as an individual voltage source and implementing a serial link of these voltage sources. Great advantages are obtained when being able to deliver high voltage loudspeaker output with only low voltage building blocks, including for example components being relatively smaller and less expensive, processing/control blocks and power blocks can be implemented on the same PCB and even more advantageously possibly even on the same chip or at least bundling the blocks with common ground potential on a single chip, less heat dissipation to cool, and more.

In an advantageous embodiment the first amplifier full bridge and the second amplifier full bridge are implemented as Class-D amplifiers.

In an advantageous embodiment the Class-D amplifiers are open-loop Class-D amplifiers.

In an advantageous embodiment the open-loop Class-D amplifiers are based on discrete-time modulation such as digital modulation.

In an advantageous embodiment the power amplifier system is arranged to establish a multi-level Class-D modulation.

In an advantageous embodiment said multi-level Class-D modulation comprises five output levels. For example, in an embodiment, the five output levels seen before any demodulation LC filters may comprise −2 A, −1 A, 0, +1 A and +2 A, where A is a rail-to-rail voltage amplitude of said two first power supply and said second power supply (assuming identical rail-to-rail voltages of the two power supplies).

When using the disclosed power amplifier system in combination with Class-D power amplifiers, the invention has a further advantage, compared to a traditional single ended or bridge-tied-load design. One of the major drawbacks of Class-D designs is the relative high amount of switching loss. However, the disclosed power amplification system may require only 50% of the switching voltage amplitude to reach the same amplifier output voltage compared to a bridge-tied-load amplifier. Assuming similar output switching capacitances and switching frequency, the total (switching) power loss in an embodiment of the disclosed power amplifier system will be reduced with a factor 2.

Beside the above mentioned reduction of power loss, the disclosed power amplifier system also enables more advanced class-D modulation schemes. With the disclosed two, preferably identical, full-bridge output devices it is possible to establish a 5-level modulation scheme: each bridge can output −A, 0 and +A, corresponding to the three possible output combinations seen over a single full bridge output terminals, giving the combined output combinations: −2 A, −A, 0 +A and +2 A seen over both full bridges. Such a multi-level class-D scheme has the advantage of further reducing switching loss, reducing EMI and reducing quantization noise. All challenges well known in the art of Class-D amplification techniques.

In a preferred embodiment of the disclosed power amplifier system, the amplifier is based upon an open-loop topology requiring no audio feedback signal.

In an advantageous embodiment said power amplifier system comprises no more than three power inductors. Thereby the complexity, costs and space requirements are even further reduced.

In aspects the isolation barrier may comprise optical isolation, transformer isolation, capacitive isolation, RF isolation or other galvanic separation techniques. In a preferred Class-D embodiment of the disclosed power amplifier, one or more of the isolation barriers are implemented as capacitive couplings using cost efficient logical gates in combination with passive resistors and capacitors. This further has the advantage of very low jitter injection compared to many low-cost opto-couplers. Added jitter in an open-loop amplifier design can be critical (significant reduction of SNR) since this forward error is not suppressed by any feedback loop mechanism.

In a preferred embodiment of the power amplifier system, the isolating power supply driving the floating amplifier is based on an additional secondary winding on the same transformer core used to implement the power supply for the non-floating amplifier.

In a preferred embodiment of the power amplifier system, the system comprises two full-bridge amplifiers and three power inductors.

In an aspect said connection between said first amplifier full bridge and said first power supply comprises a positive DC rail and a negative DC rail, and said connection between said second amplifier full bridge and said second power supply comprises a positive DC rail and a negative DC rail.

In an aspect said connection between said first amplifier full bridge and said first power supply comprises a positive DC rail and said common ground potential, and said connection between said second amplifier full bridge and said second power supply comprises a positive DC rail and a floating ground potential.

In a preferred embodiment of the power amplifier system the potential of a positive DC rail of said first power supply compared to said common ground potential corresponds to the potential of a positive DC rail of said second power supply compared to said floating ground potential.

In a preferred embodiment of the power amplifier system said audio processor comprises a PWM modulator.

In a preferred embodiment of the power amplifier system said control output comprises one or more first amplifier control signals and one or more second amplifier control signals, for example an individual control signal for each of four amplifier half-bridges in total.

In an aspect said control output comprises an audio signal.

In an aspect the present invention relates to an audio amplification method comprising providing an audio processor comprising an audio input and a control output and a first power supply having at least a positive DC rail; arranging the audio processor and the first power supply with a common ground potential; providing a second power supply having at least a positive DC rail; arranging the second power supply with a floating ground potential; providing a first amplifier full bridge and connecting it to the first power supply and the control output of the audio processor; providing a second amplifier full bridge and connecting it to the second power supply; providing an isolation barrier and establishing a connection between the control output of the audio processor and the second amplifier full bridge through said isolation barrier; arranging an amplifier interconnection between an amplifier interconnection output of said first amplifier and an amplifier interconnection output of said second amplifier; coupling a load between an amplifier output of said first amplifier and an amplifier output of said second amplifier; providing at said audio input of said audio processor an audio signal to be amplified to high voltage.

By amplifying audio according to this advantageous method, several or all of the advantages described above with regards to the power amplifier system are also achieved. The method may advantageously be carried out by a power amplifier system as disclosed.

In a preferred embodiment of the method it further comprises providing said first amplifier full bridge and said second amplifier full bridge on a single-chip device comprising at least four amplifier half-bridges.

In a preferred embodiment of the method said first power supply and said second power supply is arranged to supply no more than 80V DC, for example having a rating of 80V DC, 70V DC, 60V DC or 50V DC potential from rail-to-rail of each power supply. According to an aspect of the invention, a supply of 80V rail-to-rail will provide a maximum of 160V peak-to-peak as seen from the load, i.e. up to about 113 Vrms, and for example even a supply of only 60V rail-to-rail will provide a maximum of 120V peak-to-peak as seen from the load, i.e. up to about 85 Vrms. Thereby common 70V or 100V high-voltage distribution systems may be implemented according to an embodiment of the present invention without requiring e.g. transistors rated at 100V or more.

In a preferred embodiment of the method said first amplifier full bridge and said second amplifier full bridge are provided as a total of four amplifier half-bridges, and wherein a rail-rail supply voltage to each amplifier half-bridge is no more than 80V, such as for example 70V, 60V or 50V.

In a preferred embodiment of the method it further comprises providing said first amplifier full bridge and said second amplifier full bridge as Class-D amplifiers.

In a preferred embodiment of the method it further comprises performing PWM modulation in said audio processor.

In a preferred embodiment of the method it further comprises establishing a multi-level Class-D modulation.

In a preferred embodiment of the method the isolation barrier performs capacitive isolation.

In a preferred embodiment of the method it further comprises providing said first power supply and said second power supply on a common transformer core.

In an aspect the present invention relates to a public address system comprising a power amplifier system comprising an audio processor comprising an audio input and a control output; a first amplifier full bridge connected to a first power supply; and a second amplifier full bridge connected to a second power supply; wherein an amplifier interconnection output of said first amplifier is connected to an amplifier interconnection output of said second amplifier; wherein said first amplifier and said second amplifier each comprises an amplifier output for a load to be connected in between; wherein said first power supply and said audio processor has a common ground potential and said first amplifier is connected to said control output; wherein said second power supply is floating with respect to said common ground potential and said second amplifier is connected to said control output through an isolation barrier; and wherein said public address system further comprises an audio source input connected to said audio input and two or more loudspeakers coupled to said amplifier outputs in parallel connection with each other.

An advantageous PA system is thereby obtained with several or all of the advantages described above. The disclosed PA system may preferably be implemented in so-called 70V- or 100V-installations using a power amplifier system as disclosed.

DRAWINGS

Figure 2:
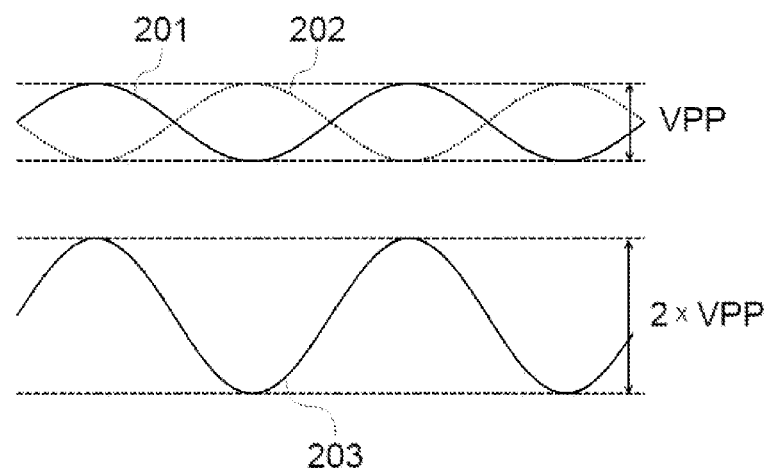
Figure 3:
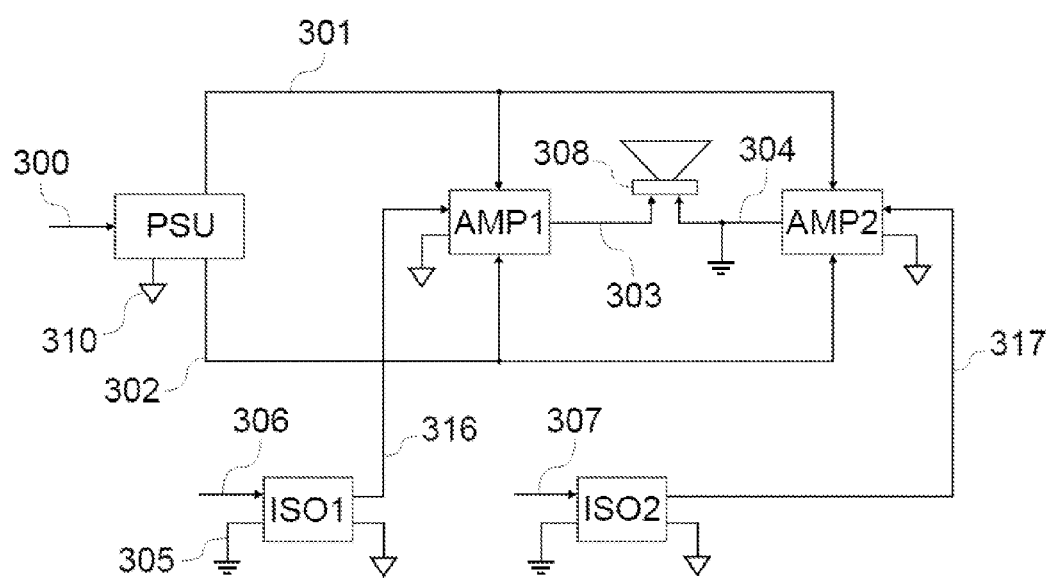
Figure 4:
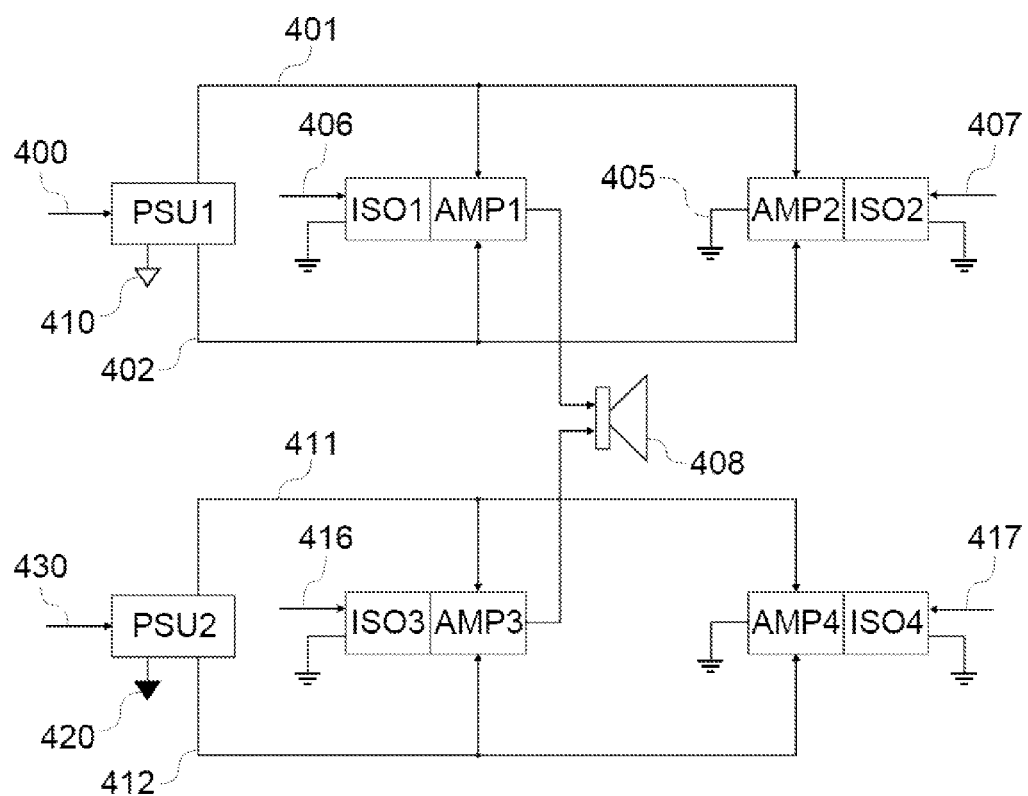
Figure 5:
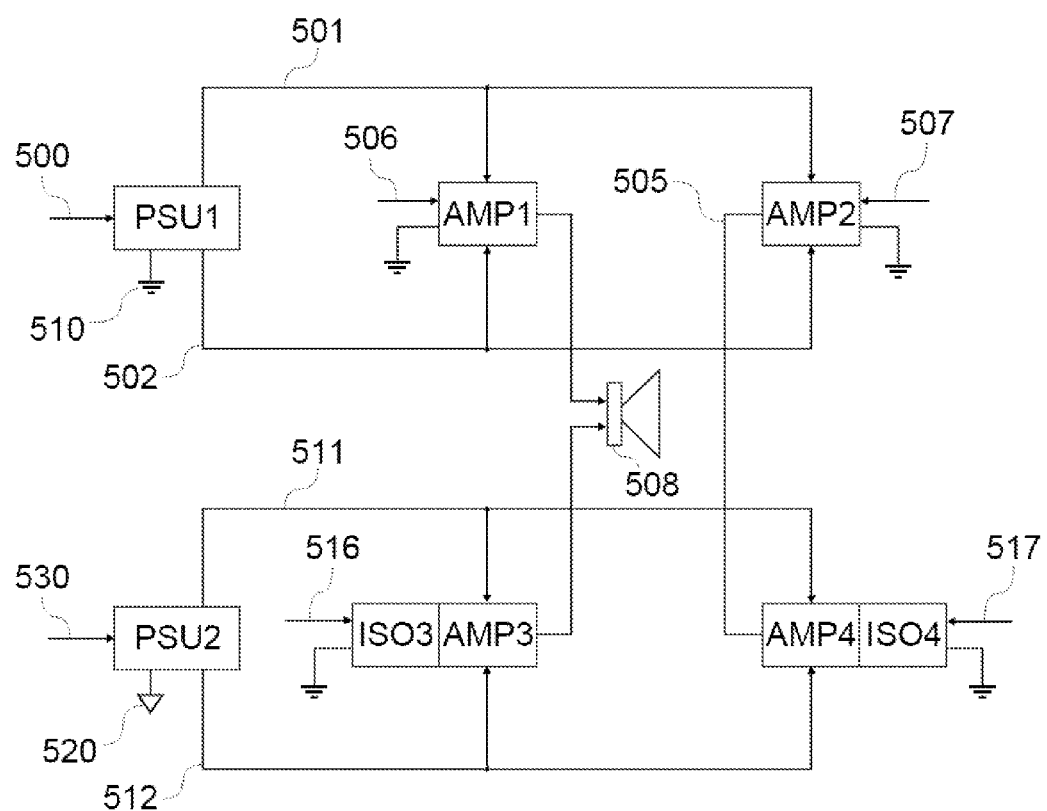
Figure 6:
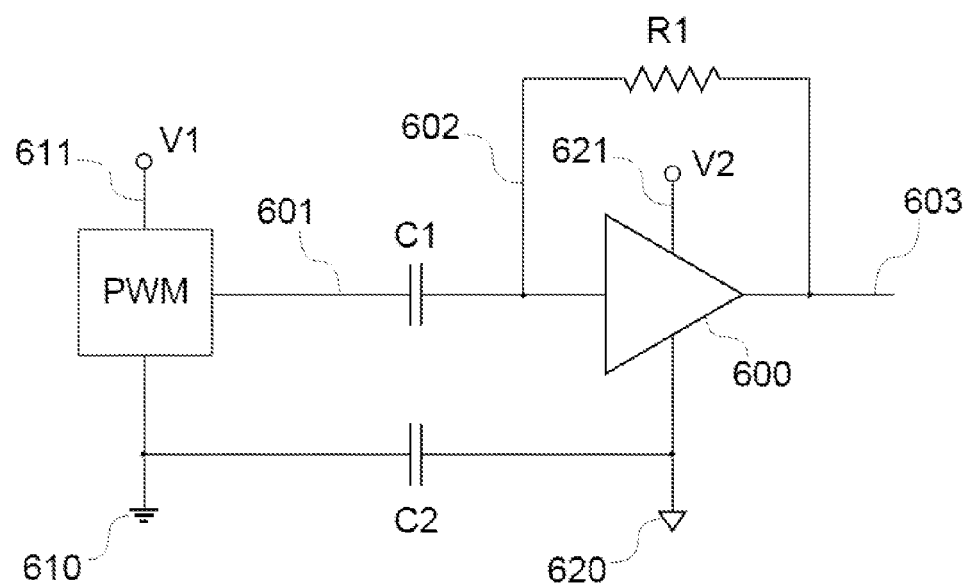
Figure 7:
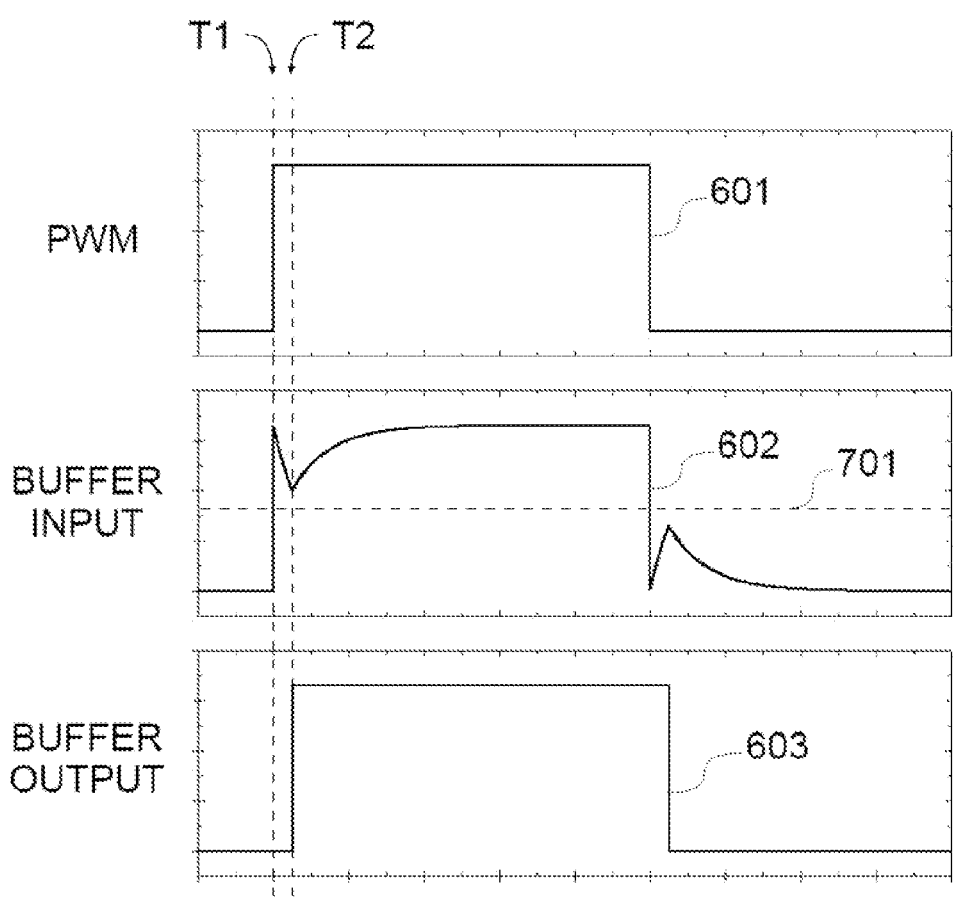
Figure 8:
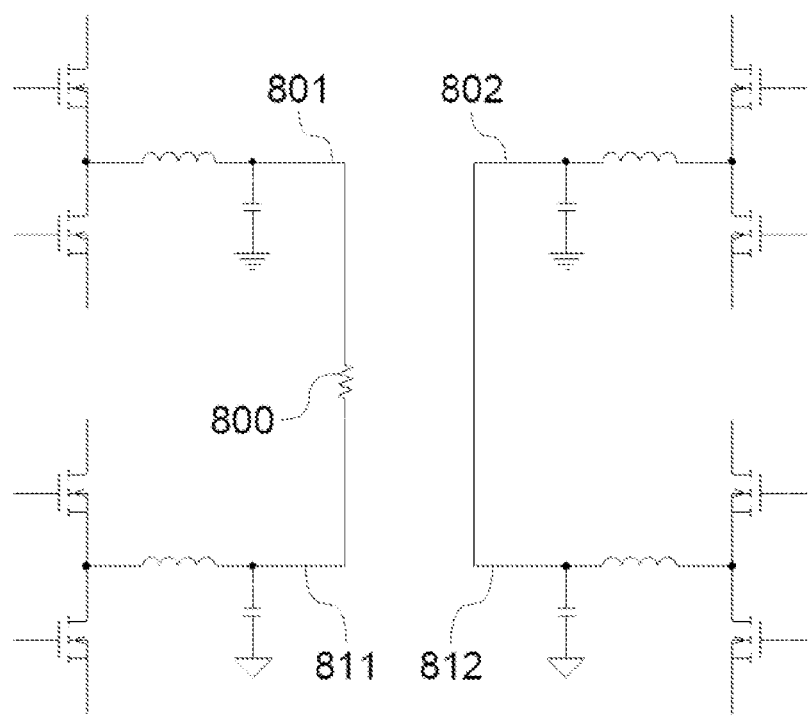
Figure 9:
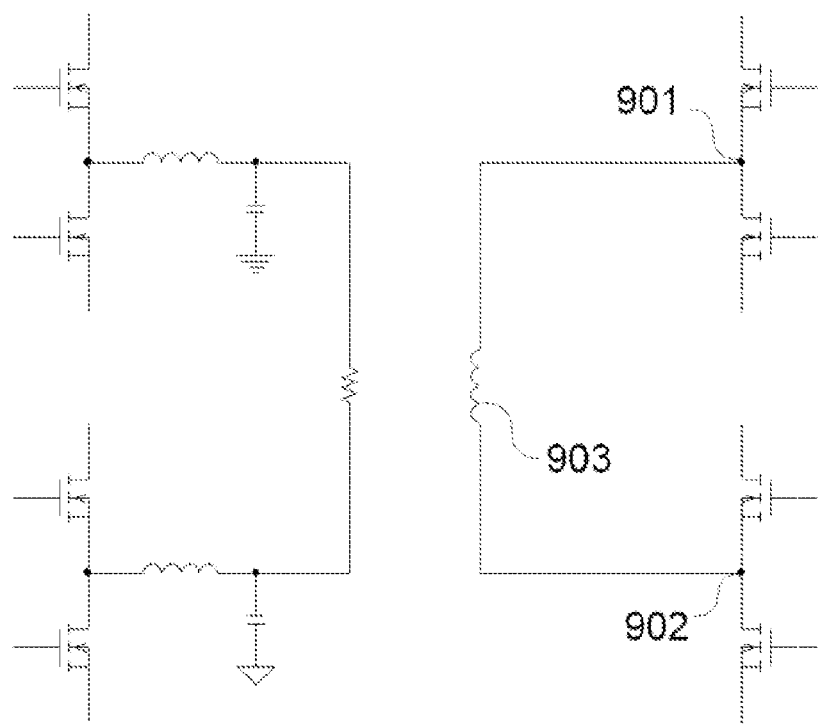
Figure 10:
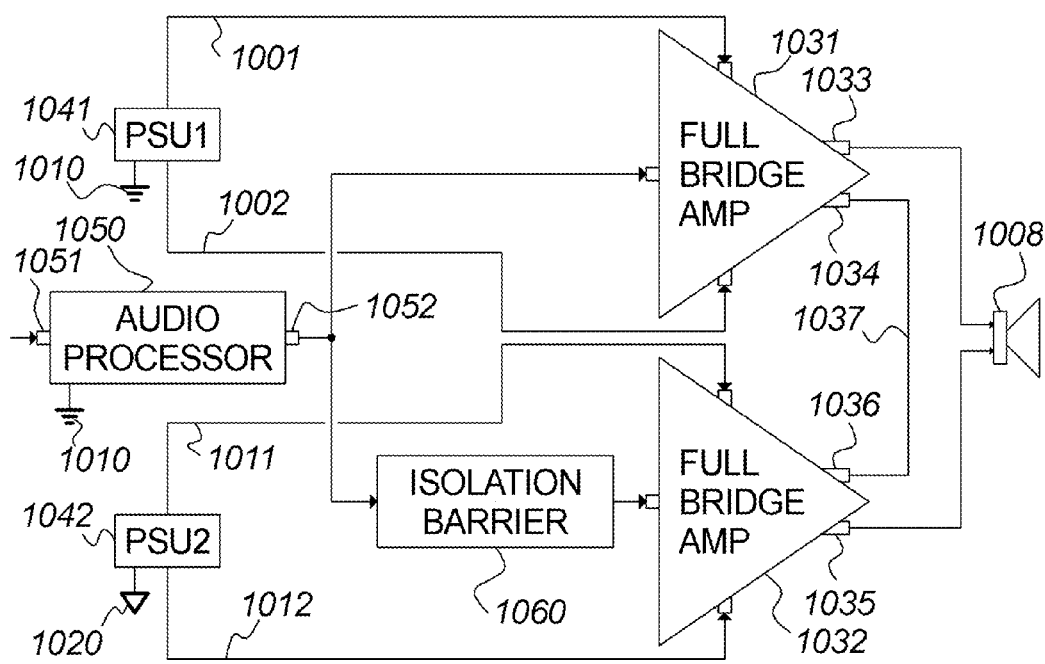
Figure 11:
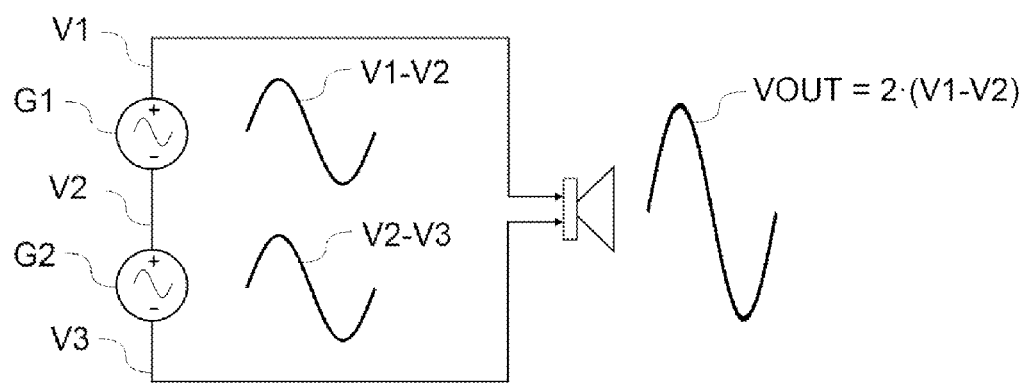

Various embodiments will in the following be described with reference to the drawings where FIG. 1 shows a traditional bridge-tied-load amplifier (prior art), FIG. 2 shows the output signals of a traditional bridge-tied-load amplifier (prior art), FIG. 3 shows a bridge-tied-load amplifier coupled as a single-ended output amplifier (prior art), FIG. 4 shows two bridge-tied-load amplifiers coupled as a single-ended output amplifier, which again are bridged-coupled (prior art), FIG. 5 illustrates a preferred embodiment of a high voltage amplifier, FIG. 6 illustrates an advantageous embodiment of an isolation barrier, FIG. 7 illustrates time domain signals of an advantageous embodiment of an isolation barrier, FIG. 8 illustrates a first preferred embodiment of a class-D half-bridge interconnection according to a preferred embodiment of a high voltage amplifier, FIG. 9 illustrates a second preferred embodiment of a class-D half-bridge interconnection according to a preferred embodiment of a high voltage amplifier, FIG. 10 illustrates a high voltage amplifier according to a preferred embodiment of the invention, and FIG. 11 illustrates a working principle of a preferred embodiment of the invention.

DETAILED DESCRIPTION OF THE EXAMPLE EMBODIMENTS

Descriptions of prior art and the present inventions will be given hereunder by reference to the drawings.

FIG. 1 shows a traditional bridge-tied-load amplifier. Such an amplifier design includes a shared power supply PSU having a system ground 105, an input voltage 100 (which is typically 115/230 VAC when operated from mains), a positive DC rail 101 and a negative DC rail 102. In case of a single supplied system, negative DC rail 102 equals system ground. The system further comprises two individual half-bridge amplifiers AMP1, AMP2, which are supplied by the DC rails 101, 102. The two half-bridge amplifiers have individual inputs 106, 107, and outputs 103, 104 to which a load 108, e.g. a loudspeaker, is connected. The half-bridge outputs 103, 104 can obtain voltage levels between the positive rail 101 and the negative rail 102. Examples of such outputs are illustrated in FIG. 2, which shows the output signals of a traditional bridge-tied-load amplifier. In this figure, the signals 201, 202 correspond to the half-bridge outputs 103, 104 found in FIG. 1. As illustrated, the amplitude of the half-bridge outputs 201, 202 is bound by the rail-to-rail voltage VPP, i.e. the voltage potential between negative rail 102 up to positive rail 101, but seen from the load perspective the voltage swing is twice of that, as illustrated by the curve 203 of FIG. 2: V(201)−V(202)=V(203)=load voltage.

In some applications it may be beneficial to have a single-ended output of an amplifier for a couple of reasons. One main advantage is that load current is quite easily measured when the return path from the load is ground potential. In such a case the current can be measured using a simple current sense resistor without having to establish an advanced current sense having large CMRR which would be required if any common mode component exist over the current sense resistor. Another advantage is that a simple single feedback system can be used to suppress error in the amplifier. FIG. 3 shows a bridge-tied-load amplifier coupled as a single-ended output amplifier. As for the traditional full bridge design illustrated in FIG. 1, the amplifier design in FIG. 3 includes a power supply PSU having a power supply ground 310, an input voltage 300, a positive DC rail 301 and a negative DC rail 302, but in this case the power supply ground does not equal system ground. The system further comprises two individual half-bridge amplifiers AMP1 and AMP2, which are supplied by the DC rails 301, 302. The two half-bridge amplifiers have individual inputs 316, 317, and outputs 303, 304 to which a load 308, e.g. a loudspeaker, is connected. One of the outputs, in this case output 304, is connected to system ground to establish the desired single-ended amplifier property. To allow output 304 of amplifier AMP2 to take any position in between the voltage rails, the amplifiers AMP1, AMP2 thus need to be floating with respect to system ground 305. This may be achieved by signal isolators ISO1, ISO2 having individual inputs 306, 307 and individual outputs 316, 317. Both signal isolators refer to the system ground 305 on their input side and to the power supply ground 310 on their output side, as also indicated in FIG. 3 by two different ground symbols.

A high voltage version of the system shown in FIG. 3 can be established by bridge-coupling two of such systems, as shown in FIG. 4. To do that it is required to isolate the two power supplies PSU1 and PSU2 from each other, but also from the system ground 405. This is illustrated by the three different ground symbols of the two power supply grounds 410, 420 and the system ground 405. Both power supplies receive an input signal 400, 430, which in principle could be the same voltage, but the DC rails 401, 402, 411, 412 are individual voltages. For single supply coupled amplifiers the negative rails 402, 412 may equal the power supply grounds 410, 420 respectively. Seen from a functional perspective the operation of the amplifiers AMP1, AMP2 in FIG. 4 equal the operation of the system seen in FIG. 3 meaning that several isolation barriers ISO1, ISO2, ISO3, ISO4 are required, each having the individual inputs 406, 407, 416, 417 with reference to system ground 405.

FIG. 5 illustrates a high voltage amplifier according to a preferred embodiment of the invention. This system comprises a first full bridge amplifier consisting of half-bridges of two amplifiers AMP1, AMP2 and a first power supply PSU1, which has a main input 500 from typical 115/230 VAC mains. Power supply PSU1 outputs a positive DC rail 501 and a negative DC rail 502 relative to system ground 510. In case of single supply topology, the negative rail 502 equals the system ground 510. The half-bridge amplifiers AMP1, AMP2 have inputs 506, 507 that refer to system ground 510.

The system further comprises a second full bridge amplifier consisting of half-bridges of two amplifiers AMP3, AMP4 and a second power supply PSU2, which has a main input 530 from typical 115/230 VAC mains. In a preferred embodiment of the invention the second power supply PSU2 simply consists of rectification means, one or more electrolytic capacitors plus an additional secondary winding on a transformer core of the first power supply PSU1. This establishes a very cost effective isolated mirror of power supply PSU1 output rails. The second power supply PSU2 thereby outputs a positive DC rail 511 and a negative rail 512 relative to a floating ground 520. In case of single supply topology, the negative rail 512 equals the floating ground 520. The half-bridge amplifiers AMP3, AMP4 have inputs through isolation barriers ISO3, ISO4 which inputs 516, 517 refer to system ground 510. A load 508, e.g. one or more loudspeakers, is connected between outputs of amplifier AMP1 of the first full bridge and amplifier AMP3 of the second full bridge. Outputs of amplifier AMP2 of the first full bridge and amplifier AMP4 of the second full bridge are connected together through connection 505. In the advantageous embodiment of FIG. 5 and other embodiments of the present invention two grounds are used as indicated by the two different ground symbols: the system ground 510 used for reference for the first power supply PSU1, the first full bridge AMP1, AMP2, and the control inputs 506, 507, 516, 517, for both full bridges, whereas the floating ground 520 is only used as reference for the second power supply PSU2, and the second full bridge amplifiers AMP3, AMP4.

When the embodiment of FIG. 5 is implemented as a Class-D power amplifier, e.g. by providing PWM control signals at the control inputs 506, 508, 516, 517, the embodiment provides a further advantage, compared to a traditional single ended or bridge-tied-load design. One of the major drawbacks of Class-D power amplifier designs is the relative high amount of switching loss. It is well known to a person skilled in the art that the power loss of charging and discharging a capacitor equals:

$$P_{LOSS} = \tfrac{1}{2} \cdot C \cdot V^2 \cdot f$$

where C is the capacitance, V is the switching voltage amplitude and f is switching frequency. This means that the switching power loss for a bridge-tied-load design (two switching nodes) will be:

$$P_1 = 2 \cdot (\tfrac{1}{2} \cdot C \cdot V^2 \cdot f) = C \cdot V^2 \cdot f$$

Now comparing the embodiment disclosed principally in FIG. 5 to a bridge-tied-load amplifier system, the embodiment of FIG. 5 requires only 50% of the switching voltage amplitude to reach the same amplifier output voltage. This means that the switching power loss of the FIG. 5-design (having four half-bridges switching with half the voltage amplitude) will be:

$$P_2 = 4 \cdot \left( \frac{1}{2} \cdot C \cdot \left( \frac{V}{2} \right)^2 \cdot f \right) = \frac{1}{2} \cdot C \cdot V^2 \cdot f$$

Assuming similar output switching capacitances and switching frequency, the total (switching) power loss in the FIG. 5-design will be reduced with a factor 2.

An implementation of the embodiment of FIG. 5 as a class-D high voltage power amplifier further enables more advanced class-D modulation schemes than conventional class-D power amplifiers. As the design has two identical full-bridge output devices it is possible to establish a 5-level modulation scheme: each bridge can output −A, 0 and +A, corresponding to the three possible output combinations seen over a single full bridge output terminals, giving the combined output combinations: −2 A, −A, 0 +A and +2 A seen over both full bridges. Such a multi-level class-D scheme has the advantage of further reducing switching loss, reducing EMI and reducing quantization noise, which are well-known problems in Class-D amplifier technology.

The isolation barriers ISO3, ISO4 may comprise e.g. optically, capacitive, inductive, magnetically or radio frequency transfer techniques or any other suitable isolation technology. FIG. 6 illustrates an advantageous embodiment of an isolation barrier for use in a class-D amplifier. A binary PWM control signal 601 containing audio information is generated in the PWM block, which can be a DSP, dedicated Class-D modulator IC, FPGA, microcontroller or any other suitable device. The PWM block is typically supplied by a relatively low voltage V1 at input 611, for example typically 3.3V DC, which refers to system ground 610. The PWM control signal 601 is passed on to a logic non-inverting buffer 600 through a capacitor C1. The buffer 600 is supplied with a second low voltage V2 at supply 621, for example typically 3.3V DC which refers to a floating ground potential 620 corresponding to floating ground 520 in FIG. 5. An example of a non-inverting buffer with desired properties is the low-cost 74HC4050D. The buffer output 603 has a positive feedback through R1 to the buffer input 602 which creates a lock mechanism when a rising or falling transition occurs at the PWM control signal 601. A current return path between the two isolated sides is established through C2. Examples of values of components C1, R1 and C2 are 100 pF, 1 kOhm and 10 nF, respectively.

FIG. 7 shows examples of time domain signals of an advantageous embodiment of an isolation barrier as described above with reference to FIG. 6. During a low to high transition of the PWM control signal 601 in FIG. 6, both sides of C1 rise instantly at a first time T1 as marked in FIG. 7 and buffer input voltage 602 propagates through the buffer. During the buffer propagation delay from the first time T1 to a second time T2, the right side of C1 discharges through R1 since buffer output 603 is low, but when buffer output finally shifts it logical state at the second time T2, right side of C1 is charged in the same direction as the PWM control signal. The same mechanism works in opposite amplitude direction. The values of logical buffer, C1, R1 and C2 are chosen to ensure that the buffer input stays at the right side of the buffer threshold 701 to avoid false triggering.

FIG. 8 illustrates a first preferred embodiment of a class-D half-bridge interconnection. The outputs 801, 811 of two half-bridge amplifiers are connected to a load 800. The two other half-bridge outputs 802, 812 are interconnected. This embodiment corresponds to the amplifier interconnection illustrated in FIG. 5, where outputs of half-bridges AMP1, AMP2 correspond to outputs 801, 802, respectively, and outputs of half-bridges AMP3, AMP4 correspond to outputs 811, 812, respectively. As shown in FIG. 8, in a preferred embodiment, each half bridge comprises two mosfets and an LC filter.

FIG. 9 illustrates a second preferred embodiment of a class-D half-bridge interconnection. Compared to the embodiment of FIG. 8, the right-side half-bridge interconnection has now been replaced by a single inductor 903 that interconnects the two switch nodes 901, 902 directly. This configuration thereby offers a complexity reduction compared to both the embodiment of FIG. 8 and prior art embodiments, as in an embodiment only three power inductors are needed. In an even more simplified embodiment of the invention the inductor can be replaced by a direct connection, but that inductor is advantageous as it helps to avoid high EMI levels.

FIG. 10 illustrates a high voltage amplifier according to a preferred embodiment of the invention. It comprises a first amplifier full bridge 1031 and a second amplifier full bridge 1032, for example corresponding to the half-bridges AMP1, AMP2 and half-bridges AMP3, AMP4 of FIG. 5, respectively. The first amplifier full bridge 1031 is connected to a first power supply 1041, for example corresponding to the first power supply PSU1 of FIG. 5, and the second amplifier full bridge 1032 is connected to a second power supply 1042, for example corresponding to the second power supply PSU2 of FIG. 5. Preferably, as described above with reference to FIG. 5, the first amplifier full bridge 1031 is thereby powered by a positive DC rail 1001 and a negative DC rail 1002, and the second amplifier full bridge 1032 is correspondingly powered by a positive DC rail 1011 and a negative DC rail 1012. Other configurations, e.g. a single supply configuration with only positive DC rail, may be applied as mentioned above.

The first amplifier full bridge 1031 comprises an amplifier output 1033 and an amplifier interconnection output 1034. The second amplifier full bridge 1032 comprises an amplifier output 1035 and an amplifier interconnection output 1036. The amplifier interconnection outputs 1034, 1036 are connected by interconnection 1037, possibly directly but preferably with filtering circuitry such as for example one or more LC filters, an inductor, etc., for example as described above with reference to FIGS. 8 and FIG. 9. The two amplifier outputs 1033, 1035 are provided as outputs for which to connect a load 1008 between, e.g. one or more loudspeakers, with or without filters, transformers, etc. In a preferred embodiment filtering is also provided in connection with the amplifier outputs 1033, 1035, e.g. LC filters, for example for performing a degree of demodulation in a Class-D amplifier embodiment, for example as described above with reference to FIGS. 8 and FIG. 9.

The high-voltage amplifier embodiment of FIG. 10 further comprises an audio processor 1050 comprising an audio input 1051 and a control output 1052. The audio processor 1050 is configured to establish control signals suitable for the particular amplifier configuration at control output 1052. The control output 1052 may for example output four separate control signals, one for each half-bridge amplifier, for example as described above regarding the half-bridge amplifier inputs 506, 507, 516, 517 of FIG. 5. In a Class-D amplifier configuration the audio processor 1050 may preferably comprise a PWM block and the control signals may preferably be binary PWM control signals such as described above with reference to FIG. 6. The audio input 1051 may be any type and configuration as long as the audio processor 1050 comprises a compatible interface for processing and establishing control signals based on an audio signal received from it. The audio input 1051 may for example be configured to receive an analog mono audio signal or a digital PCM audio signal.

The first power supply 1041 and the audio processor 1050 are configured with a common ground potential 1010, for example corresponding to the system ground 510, 610 described above with reference to FIG. 5 and FIG. 6. The second power supply 1042 is configured with a different ground potential 1020, for example corresponding to the floating ground 520, 620 described above with reference to FIG. 5 and FIG. 6. The first amplifier full bridge 1031 receives the control signal, or a relevant part of it, e.g. two out of four individual control signals, from the control output 1052 of the audio processor 1050 directly, whereas the second amplifier full bridge 1032 receives the control signal, or a relevant part of it, e.g. two out of four individual control signals, from the control output 1052 of the audio processor 1050 via an isolation barrier 1060 which is configured to decouple the ground potentials on its input and output. The isolation barrier may e.g. be a transformer, an optical isolation barrier or a capacitive barrier, e.g. an isolation barrier as described above with reference to FIG. 5 and FIG. 6. The separate ground potential 1020 of the second power supply 1042 and the decoupling caused by the isolation barrier 1060 makes the second power supply 1042 and the second amplifier full bridge 1032 floating with respect to the first power supply 1041, the first amplifier full bridge 1031 and the audio processor 1050 which all share the common ground potential 1010.

The second power supply 1042 may advantageously be provided as floating while still matching the first power supply 1041 on other parameters by making the first and second power supply share a transformer core with a single primary winding and two separate, substantially identical secondary windings, one for each of the two power supplies, for example as described above with reference to FIG. 5.

FIG. 11 illustrates a working principle of a preferred embodiment of the invention. For explanatory purposes only the output section of the system is illustrated and the two full bridge amplifiers (refer for example to amplifiers 1031, 1032 in FIG. 10) are illustrated as independent voltage generators G1, G2. The two voltage generators have a shared connection with voltage V2 between the negative terminal of G1 and the positive connection of G2. These terminals resemble for example the amplifier interconnection outputs 1034, 1036 found in FIG. 10. The positive terminal of G1 with voltage V1 and the negative terminal of G2 with voltage V3 resemble for example the amplifier outputs 1033, 1035 also found in FIG. 10.

Having identical generator signals of the two generators G1 and G2 (V1−V2=V2−V3), twice the voltage across the two generators and across an attached load, in this case illustrated as a loudspeaker, is obtained. This principle may also be derived as:

$$V1-V2=V2-V3 \Rightarrow V3=2 \cdot V2-V1$$

$$VOUT=V1-V3=V1-(2 \cdot V2-V1)=2 \cdot (V1-V2)$$

What is claimed is:

1. A power amplifier system comprising
an audio processor comprising an audio input and a control output;
a first amplifier full bridge connected to a first power supply; and
a second amplifier full bridge connected to a second power supply;
wherein an amplifier interconnection output of said first amplifier is connected to an amplifier interconnection output of said second amplifier;
wherein said first amplifier and said second amplifier each comprises an amplifier output for a load to be connected in between;
wherein said first power supply and said audio processor has a common ground potential and said first amplifier is connected to said control output;
wherein said second power supply is floating with respect to said common ground potential and said second amplifier is connected to said control output through an isolation barrier.

2. The power amplifier system of claim 1, wherein said first amplifier full bridge and said second amplifier full bridge are integrated on a single-chip device comprising at least four amplifier half-bridges.

3. The power amplifier system of claim 1, wherein said first power supply and said second power supply are arranged to supply no more than 80V DC potential from rail-to-rail of each power supply.

4. The power amplifier system of claim 1, wherein said first amplifier full bridge and said second amplifier full bridge together comprise four amplifier half-bridges, and wherein a rail-to-rail supply voltage to each amplifier half-bridge is no more than 80V.

5. The power amplifier system of claim 1, wherein the first amplifier full bridge and the second amplifier full bridge are implemented as Class-D amplifiers.

6. The power amplifier system of claim 5, wherein the Class-D amplifiers are open-loop Class-D amplifiers.

7. The power amplifier system of claim 6, wherein the open-loop Class-D amplifiers are based on discrete-time modulation.

8. The power amplifier system of claim 5 arranged to establish a multi-level Class-D modulation.

9. The power amplifier system of claim 8, wherein said multi-level Class-D modulation comprises five levels.

10. The power amplifier system of claim 1 comprising no more than three power inductors.

11. The power amplifier system of claim 1, wherein the isolation barrier comprises optical isolation.

12. The power amplifier system of claim 1, wherein the isolation barrier comprises transformer isolation.

13. The power amplifier system of claim 1, wherein the isolation barrier comprises capacitive isolation.

14. The power amplifier system of claim 1, wherein the isolation barrier comprises RF isolation.

15. The power amplifier system of claim 1, where said first amplifier full bridge and said second amplifier full bridge are arranged on a common printed circuit board.

16. The power amplifier system of claim 1, wherein said first power supply and said second power supply share a common transformer core.

17. The power amplifier system of claim 1, wherein said connection between said first amplifier full bridge and said first power supply comprises a positive DC rail and a negative DC rail, and said connection between said second amplifier full bridge and said second power supply comprises a positive DC rail and a negative DC rail.

18. The power amplifier system of claim 1, wherein said connection between said first amplifier full bridge and said first power supply comprises a positive DC rail and said common ground potential, and said connection between said second amplifier full bridge and said second power supply comprises a positive DC rail and a floating ground potential.

19. The power amplifier system of claim 1, wherein the potential of a positive DC rail of said first power supply compared to said common ground potential corresponds to the potential of a positive DC rail of said second power supply compared to said floating ground potential.

20. The power amplifier system of claim 1, wherein said audio processor comprises a PWM modulator.

21. The power amplifier system of claim 1, wherein said control output comprises one or more first amplifier control signals and one or more second amplifier control signals.

22. The power amplifier system of claim 1, wherein said control output comprises an audio signal.

23. A high voltage audio amplification method comprising
providing an audio processor comprising an audio input and a control output and a first power supply having at least a positive DC rail;
arranging the audio processor and the first power supply with a common ground potential;
providing a second power supply having at least a positive DC rail;
arranging the second power supply with a floating ground potential;
providing a first amplifier full bridge and connecting it to the first power supply and the control output of the audio processor;
providing a second amplifier full bridge and connecting it to the second power supply;
providing an isolation barrier and establishing a connection between the control output of the audio processor and the second amplifier full bridge through said isolation barrier;
arranging an amplifier interconnection between an amplifier interconnection output of said first amplifier and an amplifier interconnection output of said second amplifier;
coupling a load between an amplifier output of said first amplifier and an amplifier output of said second amplifier;
providing at said audio input of said audio processor an audio signal to be amplified to high voltage.

24. The high voltage audio amplification method of claim 23, comprising providing said first amplifier full bridge and said second amplifier full bridge on a single-chip device comprising at least four amplifier half-bridges.

25. The high voltage audio amplification method of claim 23, wherein said first power supply and said second power supply are arranged to supply no more than 80V DC potential from rail-to-rail of each power supply.

26. The high voltage audio amplification method of claim 23, wherein said first amplifier full bridge and said second amplifier full bridge are provided as a total of four amplifier half-bridges, and wherein a rail-to-rail supply voltage to each amplifier half-bridge is no more than 80V.

27. The high voltage audio amplification method of claim 23, comprising providing said first amplifier full bridge and said second amplifier full bridge as Class-D amplifiers.

28. The high voltage audio amplification method of claim 23, comprising performing PWM modulation in said audio processor.

29. The high voltage audio amplification method of claim 23, comprising establishing a multi-level Class-D modulation.

30. The high voltage audio amplification method of claim 23, wherein the isolation barrier performs capacitive isolation.

31. The high voltage audio amplification method of claim 23, comprising providing said first power supply and said second power supply on a common transformer core.

32. A public address system comprising
a power amplifier system comprising
an audio processor comprising an audio input and a control output;
a first amplifier full bridge connected to a first power supply; and
a second amplifier full bridge connected to a second power supply;
wherein an amplifier interconnection output of said first amplifier is connected to an amplifier interconnection output of said second amplifier;
wherein said first amplifier and said second amplifier each comprises an amplifier output for a load to be connected in between;
wherein said first power supply and said audio processor has a common ground potential and said first amplifier is connected to said control output;
wherein said second power supply is floating with respect to said common ground potential and said second amplifier is connected to said control output through an isolation barrier;

and wherein said public address system further comprises an audio source input connected to said audio input and two or more loudspeakers coupled to said amplifier outputs in parallel connection with each other.

* * * * *